United States Patent [19]

Misumi et al.

[11] Patent Number: 4,972,799

[45] Date of Patent: Nov. 27, 1990

[54] MICROWAVE PLASMA CHEMICAL VAPOR DEPOSITION APPARATUS FOR MASS-PRODUCING FUNCTIONAL DEPOSITED FILMS

[75] Inventors: Teruo Misumi; Masaaki Yamamura; Minoru Kato, all of Nagahama, Japan

[73] Assignee: Canon Kabushiki Kaisha, Tokyo, Japan

[21] Appl. No.: 469,943

[22] Filed: Jan. 25, 1990

[30] Foreign Application Priority Data

Jan. 26, 1989 [JP] Japan .................................... 1-14996

[51] Int. Cl.$^5$ ............................................ C23C 16/50
[52] U.S. Cl. .................................. 118/723; 118/729; 118/730; 118/733; 118/50.1
[58] Field of Search ............... 118/723, 729, 730, 733, 118/50.1

[56] References Cited

U.S. PATENT DOCUMENTS

4,666,734  5/1987  Kamiya .................................. 427/39
4,840,139  6/1989  Takei .................................... 118/723

Primary Examiner—Richard Bueker
Attorney, Agent, or Firm—Fitzpatrick, Cella, Harper & Scinto

[57] ABSTRACT

In a microwave plasma chemical vapor deposition apparatus which comprises a substantially enclosed deposition chamber, a means for supporting a substrate on which a functional deposited film is to be formed, a means for supplying raw material gases, a means for evacuating the inside of said deposition chamber and a means for generating microwave discharge plasmas in said deposition chamber which includes a waveguide extending from a microwave power source and a microwave introducing window through which a microwave energy is to be introduced into said deposition chamber, the improvement characterized in that said apparatus is provided with a holding member capable of holding said microwave introducing window and said substrate and capable of sealing said deposition chamber in a air-tight state upon film-formation and said apparatus is provided with a means for transporting said holding member under vacuum condition.

5 Claims, 4 Drawing Sheets

MICROWAVE PLASMA CHEMICAL VAPOR DEPOSITION APPARATUS FOR MASS-PRODUCING FUNCTIONAL DEPOSITED FILMS

FIELD OF THE INVENTION

This invention relates to an improved microwave plasma chemical vapor deposition apparatus which enables one to mass-produce a functional deposited film such as amorphous silicon system functional deposited film, which is usable especially as a photoconductive member for semiconductor devices, photosensitive devices for use in electrophotography, image input line sensors, image pickup devices, photovoltaic devices or the like.

BACKGROUND OF THE INVENTION

Hitherto, as the element member of semiconductor devices, photosensitive devices for use in electrophotography, image input line sensors, image pickup devices, or other optical devices, there have been proposed a number of amorphous semiconductor films, for instance, an amorphous deposited film composed of an amorphous silicon material compensated with hydrogen atoms (H) or/and halogen atoms (X) such as fluorine atoms or chlorine atoms [hereinafter referred to as "a-Si(H,X)"]. Some of such films have been put to practical use.

Along with those amorphous semiconductor films, there have been proposed various methods for their preparation using plasma chemical vapor deposition technique wherein a raw material is decomposed by subjecting it to the action of an energy of direct current, high frequency or microwave glow discharging to thereby form a deposited film on a substrate of glass, quartz, heat-resistant resin, stainless steel or aluminum. And there have been also proposed various apparatus for practicing such methods.

Now, in recent years, the public attention has been focused on plasma chemical vapor deposition process by means of microwave glow discharging decomposition [hereinafter expressed by the abbreviation "MW-PCVD process"] also at industrial level.

One representative apparatus for practicing such MW-PCVD process is such that has a structure as shown in a schematic drawing of FIG. 3 (this apparatus will be hereinafter referred to as "MW-PCVD apparatus").

Figure 3:
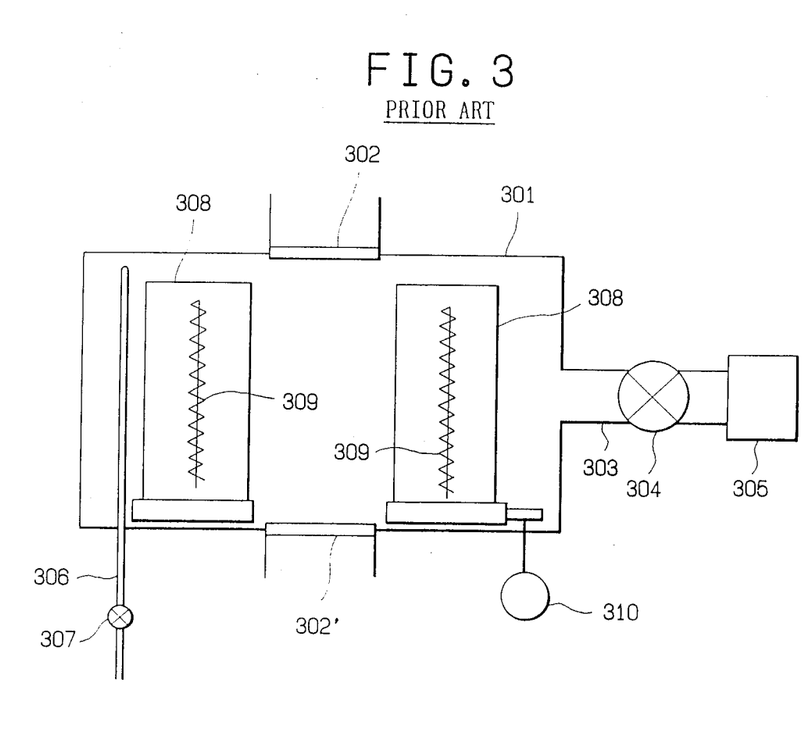
FIG. 3 is a schematic section view illustrating the constitution of the known MW-PCVD apparatus.

In FIG. 3, there are shown a substantially enclosed deposition chamber 301, a microwave introducing window 302 (or 302') made of a dielectric material such as alumina ceramics or quartz which is connected through a waveguide to a microwave power source (not shown), an exhaust pipe 303 extending through an exhaust valve 304 from a vacuum pump 305, a raw material gas feed pipe 306 having a plurality of gas liberation holes (not shown) which is extending through a flow rate control valve 307 from a gas reservoir (not shown), a plurality of cylindrical substrates 308 each being positioned on a rotatable cylindrical substrate holder having an electric heater 309 therein, and a drive motor 310 for rotating said cylindrical substrate holder. The deposition chamber 301 ordinarily has a cavity resonant structure so as to resonate with the frequency of the microwave power source. Film-formation in the apparatus shown in FIG. 3 is carried out, for example, in the following manner.

That is, the inside of the deposition chamber 301 is evacuated by opening the exhaust valve 307 of the exhaust pipe 306 to bring the inside to a desired vacuum. The heater 309 is actuated to uniformly heat the cylindrical substrate 308 to a desired temperature while rotating it by the drive motor 310 and it is kept at this temperature. Then, raw material gases, for instance, silane gas and hydrogen gas, etc. in the case of forming an amorphous silicon deposited film, are introduced into the deposition chamber 301 through the gas feed pipe 306 and its gas liberation holes.

At the same time, microwave having a frequency of more than 500 MHz, preferably of 2.45 GHz is generated by the microwave power source, which is successively introduced into the deposition chamber 301 through the microwave introducing window 302 (or/and 302'). The raw material gases thus introduced into the deposition chamber 301 are excited and dissociated by an energy of the microwave to generate neutral radical particles, ion particles, electrons and the like and to cause chemical reactions among them resulting in formation of an amorphous silicon deposited film on the surface of each of the cylindrical substrates 308.

However, with the conventional MW-PCVD apparatus having such constitution as described above, there are the following disadvantages: (i) it is necessary to put the inside of the deposition chamber to the atmospheric pressure when a substrate on which a film is to be deposited is placed therein or when the substrate is removed therefrom or when one or both of the microwave introducing windows is replaced by a new one; (ii) manual operation is required for replacement or removl of the substrate and because of this, improvements in the quality and the yield of the products can not be anticipated because of unavoidable contamination of foreign matters and so forth; (iii) in order to improve the situation mentioned in the above (ii). the replacement and removal of the microwave introducing window or the substrate are commonly performed under vacuum condition, but it is necessary for the MW PCVD apparatus to be additionally provided with a relevant transportation mechanism for this purpose and such transportation mechanism will be complicated as the number of substrates is increased; and (iv) in the case of the above (iii), as the microwave introducing window(s) and the substrate(s) are transported separately, it takes much time to perform this operation.

SUMMARY OF THE INVENTION

The present invention is aimed at eliminating the foregoing disadvantages of the conventional MW-PCVD apparatus and providing an improved MW-PCVD apparatus which enables one to stably and repeatedly mass-produce a desirable functional deposited film which is usable as an element member for semiconductor devices, photosensitive devices for use in electrophotography, image reading line sensors, image pickup devices, photoelectromotive members, or other electronic and optical devices at a high deposition rate.

The principal object of the present invention is to provide an improved MW-PCVD apparatus which enables one to stably and repeatedly mass-produce a desirable functional deposited film having a wealth of excellent electric, optical and photoconductive characteristics at a high deposition rate not only in the case where a large square substrate is used but also in the case where said deposited film is desired to be thick.

Another object of the present invention is to provide an improved MW-PCVD apparatus which enable one to stably and repeatedly mass produce a relatively thick functional deposited film of large square having a wealth of electrophotographic characteristics for an electrophotographic photosensitive device.

The present inventors have made earnest studies for eliminating the foregoing disadvantages of the known MW-PCVD apparatus and attaining the objects of the present invention and as a result, have obtained a finding that such disadvantages of the known MW-PCVD apparatus can be overcome by providing a proper mechanism which is capable of holding a substrate, is capable of holding a means for introducing microwave into the deposition chamber which comprises a waveguide and a microwave introducing window, is capable of constituting part of the circumferential wall of the deposition chamber upon film-formation and also is capable of easily being transported under vacuum condition with the apparatus.

Therefore, the principal feature of the present invention is directed to an improvement in the known MW-PCVD apparatus which comprises a substantially enclosed deposition chamber, a means for supporting a substrate on which a functional deposited film is to be formed, a means for supplying a raw material gas, a means for evacuating the inside of said deposition chamber and a means for generating microwave discharge plasmas in said deposition chamber including a waveguide and a microwave introducing window, the improvement characterized in that said apparatus is provided with a mechanism capable of holding the substrate and a means for introducing microwave into the deposition chamber which comprises a waveguide and a microwave introducing window, constituting part of the circumferential wall of the deposition chamber upon film-formation and easily being transported under vacuum condition.

The MW-PCVD apparatus thus structured makes it possible to automatically mass-produce a desirable functional deposited film. In addition, according to the MW-PCVD apparatus of the present invention, the foregoing problems with respect to contamination of the foreign matters which are found on the known MW-PCVD apparatus can be effectively eliminated.

The MW-PCVD apparatus of the present invention is particularly suitable for mass-producing a desirable electrophotographic photosensitive device.

DESCRIPTION OF THE PREFERRED EMBODIMENTS OF THE INVENTION

The MW-PCVD apparatus to be provided according to the present invention which has the constitution as described above provides such significant advantages as will be under described.

(1) a plurality of substrates each having a deposited film formed thereon and a microwave introducing window can be together transported easily even under vacuum condition since the substrates and the microwave introducing window are held by a holding member which is corresponding to the mechanism as above explained;

(2) the holding member also serves as a removable opening and sealing member for the deposition chamber and because of this, the opening and sealing mechanism of the deposition chamber is structurally simplified and the efficiency as a mass-production apparatus is markedly improved; and (3) it is possible for the holding member to be provided with other functions than what above described such that the facility of transporting the substrates and the microwave introducing window is further improved and reduction in contamination of foreign matters into a film to be deposited is further enhanced.

The MW-PCVD apparatus may be so designed to have a plurality of deposition chambers and/or a furnace for heating the substrates on each of which a film is to be deposited. In this case, the mass-productivity of a functional deposited film is further improved.

Figure 1:
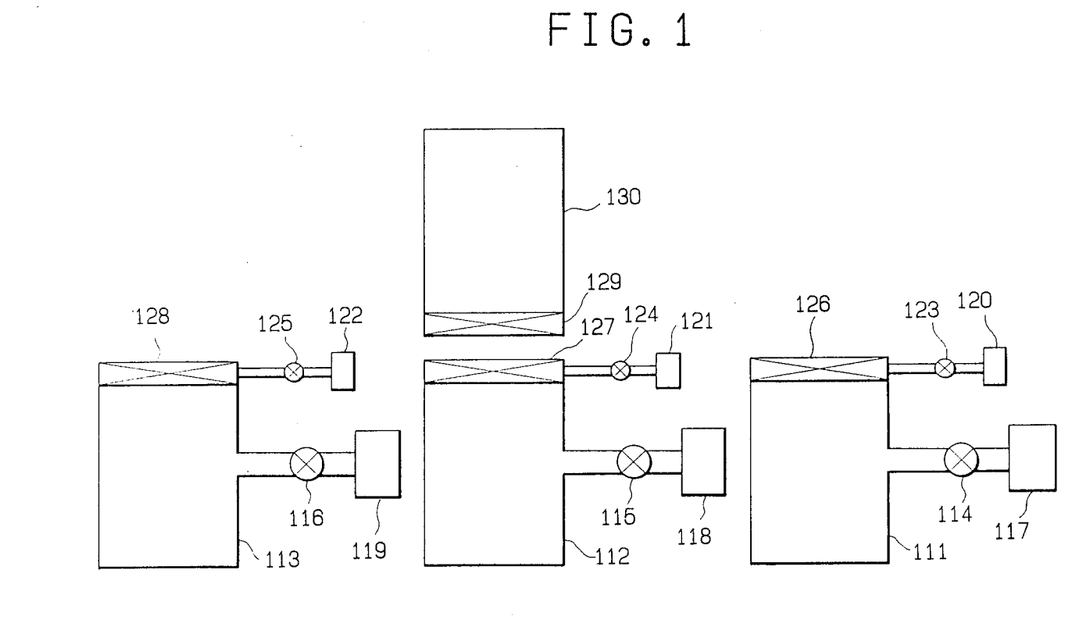
FIG. 1 is a schematic explanatory view of the entire of the MW-PCVD apparatus according to the present invention.
Figure 2:
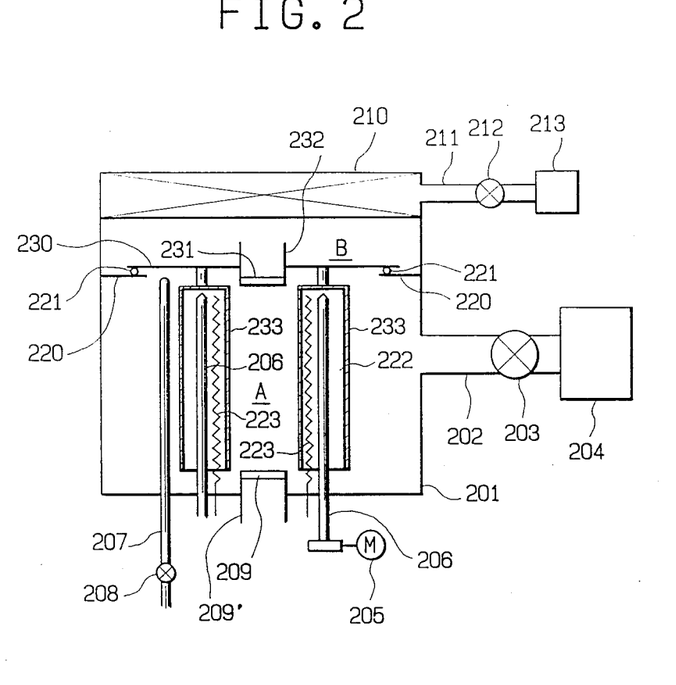
FIG. 2 is a schematic section view illustrating the constitution of the MW-PCVD apparatus according to the present invention.
Figure 4:
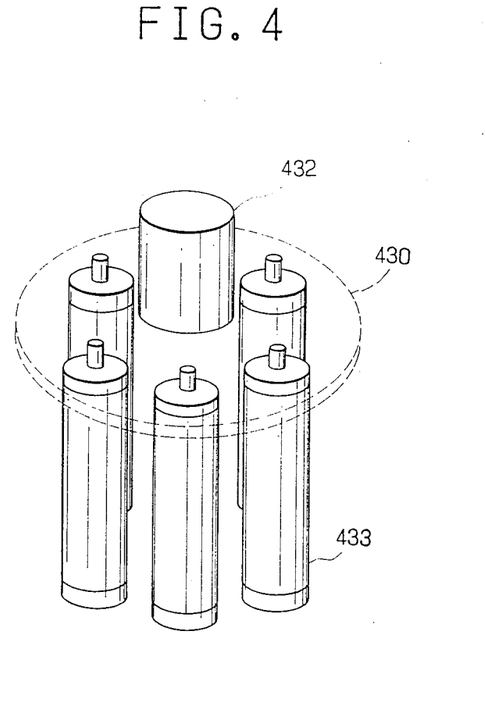
FIG. 4 is a schematic explanatory view of the situation of the holding member in the MW-PCVD apparatus according to the present invention wherein a microwave introducing means comprising a waveguide and a microwave introducing window and six cylindrical substrate on each of which a film is to be deposited are together held by said holding member.

In the following, the MW-PCVD apparatus according to the present invention will be described more in detail with reference to the drawings (FIG. 1, FIG. 2 and FIG. 4).

In FIG. 1, there is shown a layout of the entire of the MW-PCVD apparatus according to the present invention in which are shown three deposition chambers 111, 112 and 113 and a movable vacuum vessel 130 which serves to assemble a microwave introducing means comprising a waveguide and a microwave introducing window and a substrate onto a holding member under vacuum condition.

This situation for the holding member becomes apparent by referring to FIG. 4 in which is shown a holding member 430 to which a microwave introducing unit comprising a waveguide member 432 and a microwave introducing window (not shown) and a plurality of cylindrical substrates 433 being fixed.

The movable vacuum vessel 130 also serves to transport the assemble comprising said microwave introducing unit and said plurality of cylindrical substrates being fixed to the holding member as shown in FIG. 4 to any of the deposition chambers 111, 112 and 113 under vacuum condition other than what above described.

Now, referring to FIG. 1, each of the deposition chambers 111, 112, and 113 is provided with an exhaust pipe (not shown) connected through an exhaust valve (114, 115 or 116) to a vacuum pump (117, 118 or 119) and a raw material gas feed pipe having a flow rate control valve which is extended from a gas reservoir (this part is not shown). Each of the deposition chambers 111, 112, 113 is provided with a gate valve (126, 127 or 128) having a exhaust pipe connected through a control valve (123, 124 or 125) to a vacuum pump (120, 121 or 122). The movable vacuum vessel is provided with a gate valve 129 and a exhaust pipe being connected through a control valve to a vacuum pump (this part is not shown). Upon transporting the foregoing assemble comprising the microwave introducing unit and the cylindrical substrates fixed onto the holding member from the movable vacuum vessel 130 to, for example, to the deposition chamber 112 among others, the vacuum vessel 130 is moved, for example, by means of a mobile equipment in the case of horizontal movement (not shown) or/and by means of an air cylinder in the case of vertical movement (not shown) to the deposition chamber 112 such that the gate valve 129 of the movable vacuum chamber 130 and the gate valve 127 of the deposition chamber 112 are face to face contacted so as to be sealed. At this time, the inside of the movable vacuum vessel 130 and the inside of the deposition chamber 112 are maintained at the same vacuum by actuating the respective vacuum pumps. Then, the vacuum pump 121 for the gate valve 127 of the deposition chamber 112 is actuated to evacuate a clearance between the gate valve 127 and the gate valve 129 to make said clearance air-tight. Then, the two gate valves are opened and the foregoing assemble is moved into the deposition chamber 112 from the movable vacuum vessel 130 by a proper vertical transportation mechanism such as an air cylinder (not shown) installed in the movable vacuum vessel such that the inside (film-forming space) of the deposition chamber 112 is substantially enclosed by the holding member in the way as shown in FIG. 2.

After the foregoing assemble being thus transported into the deposition chamber 112, the two gate valves 127 and 129 are closed and the movable vacuum vessel 130 is moved upward. Then, the gate valve 127 is opened to bring the air-tight space between the gate valve 127 and the holding member to an atmospheric pressure. Thereafter, a wave guide unit comprising a waveguide and a microwave power source connected to said waveguide is connected to the waveguide of the foregoing assemble.

Thus, the situation is prepared to start film-formation.

Additionally explaining, to take out the foregoing assemble from the deposition chamber 112 is carried out in a similar manner to the foregoing by using the movable vacuum vessel 130.

FIG. 2 schematically shows the situation where the foregoing assemble has been moved into the deposition chamber from the movable vacuum vessel in the way as described above.

In FIG. 2, there is shown a deposition chamber 201 which is provided with an exhaust pipe 202 connected through an exhaust valve 203 to a vacuum pump 204, a raw material gas feed pipe 207 provided with a plurality of gas liberation holes (not shown) which is extended from a gas reservoir (not shown) through a flow rate control valve 208. Numeral reference 210 stands for a gate valve provided with the deposition chamber 201, and the gate valve 210 is connected through a control valve 212 to a vacuum pump 213. Numeral reference 222 stands for a rotatable cylindrical substrate holder having an electric heater 223 installed therein. The cylindrical substrate holder 222 is supported by a rotary shaft 206 connected to a drive motor 205. Consequently, the cylindrical substrate holder 222 can be rotated by actuating the drive motor 205. With the bottom wall of the deposition chamber 201, there is provided a microwave introducing window 209 heremetically arranged on the open end of a waveguide 209' extending from a microwave power source (not shown) so as to apply a microwave energy through said microwave introducing window into a discharge space A circumscribed by a plurality of said cylindrical substrate holders 222 in the deposition chamber 201. Now, numeral reference 230 stands for the foregoing transported holding member to which a microwave introducing unit comprising a microwave introducing window 231 hermetically arranged on the open end of a waveguide 232 and a plurality of cylindrical substrates 233 being fixed. Upon transporting said holding member 230 into the deposition chamber 201 from the foregoing movable vacuum vessel through the gate valve 210, said holding member 230 is so guided by the foregoing vertical transportation mechanism such that each of said plurality of cylindrical substrates 233 is desirably positioned on each of the cylindrical substrate holders 222 and the microwave introducing window 232 is desirably arranged at a position opposite to the other microwave introducing window 209 so as to effectively apply a microwave energy into the discharge space A. Numeral reference 220 stands for a projected member to be overlapped with the holding member 230 so as to seal the discharge space A. Numeral reference 221 stands for an electromagnetic wave shielding means placed in the clearance at the overlapped portion between the holding member 230 and the projected member 220 to ensure the sealing of the discharge space A.

The electromagnetic wave shielding member 221 is made of a material having an elasticity sufficient enough to follow the changes in said clearance. There is present a space B between the gate valve 227 and the holding member 222. This space B is utilized when a waveguide extending from a microwave power source (not shown) is connected to the waveguide 232 of the foregoing microwave introducing unit in the same manner as described above.

In the case of forming a functional deposited film on each of the cylindrical substrates 233 in the deposition chamber 201 shown in FIG. 2, film-formation is carried out, for example, in the following manner. That is, the enclosed space having the discharge space A of the deposition chamber 201 is firstly evacuated by actuating the vacuum pump 204 and it is maintained at a desired vacuum. Then, each of the cylindrical substrates 233 is rotated by actuating the drive motor 205. At the same time, each of the cylindrical substrates 233 is heated by the electric heater 223 to and is maintained at a desired temperature. Thereafter, a film-forming raw material gas is fed into the discharge space A at a predetermined flow rate through the gas feed pipe 207 and its gas liberation holes.

The gas pressure of the discharge space A is adjusted to and it is maintained at a predetermined value by regulating the exhaust valve 203. After the flow rate of the film-forming raw material gas becomes stable, a microwave energy of a desired power generated by the microwave power source is applied through the waveguide 232 and the microwave introducing window 231 into the discharge space A. At this time, it is possible to apply a microwave energy through the lower microwave introducing window 209. Thus, there is caused glow discharge in the discharge space A and a functional deposited film is formed on each of the cylindrical substrates 233.

In the following, transportation procedures of the assemble comprising the holding member to which the foregoing microwave introducing unit having the microwave introducing window and the cylindrical substrates in the MW-PCVD apparatus according to the present invention shown in FIGS. 1, 2 and 4 will be described without making explanation about the film-forming procedures.

Firstly, the movable vacuum vessel 130 is moved by means of a mobile equipment (not shown) to the deposition chamber 112 corresponding to the deposition chamber 201 (FIG. 2), and the gate valve 129 of the movable vacuum vessel and the gate valve 127 of the deposition chamber 112 corresponding to the gate valve 210 of the deposition chamber 201 (FIG. 2) are face to face contacted.

Then, the inside of the movable vacuum vessel is evacuated and the inside is maintained at a desired vacuum. Likewise, the inside of the deposition chamber 112 (the deposition chamber 201 in FIG. 2) is evacuated and the inside is maintained at the same vacuum as in the above. Thereafter, the vacuum pump 120 (the vacuum pump 213 in FIG. 2) is actuated to evacuate a clearance between the two gate valves and to seal said clearance in an air-tight state. Thereafter, the two gate valves are opened, and the holding member 230 (in FIG. 2) to which the foregoing microwave introducing unit having the microwave introducing window 231 and the cylindrical substrates 233 each having a deposited film thereon which was formed in the deposition chamber 112 (that is the deposition chamber 201) is lifted by means of an air-cylinder (not shown) into the movable vacuum vessel 130. Thereafter, the two gate valves are closed. Then, in the case of forming a second deposited film on the previously formed deposited film on each of the cylindrical substrates, the foregoing assemble positioned in the movable vacuum vessel 130 is moved to other deposition chamber, for example, to the deposition chamber 111 for forming said second layer. In this case, if necessary, the microwave introducing window is replaced by a new one in the movable vacuum vessel 130.

In the same manner as in the above, the gate valve 129 of the movable vacuum vessel 130 is face to face contacted with the gate valve 126 of the deposition chamber 111. A clearance between the two gate valves is made air-tight by actuating the vacuum pump 120 of the deposition chamber 111. In this case, it is necessary for the inside of the movable vacuum chamber 130 and the inside of the deposition chamber 111 to be maintained at the same vacuum in the same manner as described above. Then, the two gate valves are opened and the foregoing assemble is introduced into the deposition chamber 111 from the movable vacuum chamber 130 in the same way as described in the case of FIG. 2.

The two gate valves are then closed. The movable vacuum vessel 130 is moved upward.

The gate valve 126 is opened to bring the air-tight space between said gate valve 126 and the holding member of the assemble to an atmospheric pressure. The wave guide of a waveguide unit connected to a microwave power source (not shown) is connected to the waveguide of the assemble. Film-formation of the second deposited film is started. After the film formation in this deposition chamber, the assemble is lifted into the movable vacuum vessel in the same manner as described above. In the case where further film-formation is desired, the assemble is moved to other deposition chamber in the same manner as described above. Otherwise, the cylindrical substrates each having two deposited films being laminated thereon are removed from the assembly after the inside of the movable vacuum vessel being returned to the atmospheric pressure.

Thus, according to the MW-PCVD apparatus of the present invention, it is possible to stably and repeatedly mass-produce a desired deposited film product without any of the foregoing problems found in the case of the known MW-PCVD apparatus.

In the following examples of forming a functional deposited film by the MW-PCVD apparatus according to the present invention and comparative examples of forming a functional deposited film by the known MW-PCVD apparatus will be described.

Film-forming Examples By The MW-PCVD Apparatus of The Present Invention (EXAMPLE 1)

There were provided six cylindrical aluminum substrates (A to F) of 108 mm in outer diameter, 5 mm in thickness and 358 mm in length.

These six cylindrical substrates (433) were concentrically arranged around a microwave introducing unit comprising a microwave introducing window placed on the open end of a waveguide member (432) which was positioned at the center of a holding member (430) in the way as shown in FIG. 4 in a clean atmosphere. This assemble was placed in the movable vacuum vessel 130, and the movable vacuum vessel was evacuated and its inside was maintained at about $1 \times 10^{-5}$ Torr. The vacuum vessel was moved to the deposition chamber 112, and the gate valve 129 of the former and the gate valve 127 were face to face contacted. At this time, the deposition chamber 112 was evacuated and its inside was maintained at about $1 \times 10^{-5}$ Torr. Then, a clearance between the two gate valves was made air-tight by actuating the vacuum pump 121. Thereafter, the assemble was introduced into the deposition chamber 112 from the vacuum vessel 130 in the same manner as described above and it was settled in the same way as shown in FIG. 2. Then, to the waveguide member of the assemble, a waveguide extending from a microwave power source (not shown) was connected. Then, the six cylindrical aluminum substrates were heated to and maintained at 300° C. while rotating them at a predetermined rotation speed. Thereafter, SiH$_4$ gas, H$_2$ gas, B$_2$H$_6$ gas and NO gas were fed through the gas feed pipe and its gas liberation holes into the deposition chamber 112 at respective flow rates of 500 sccm, 500 sccm, 2000 ppm and 20 sccm. Then, the gas pressure in the deposition chamber 112 was adjusted to $10^{-2}$ Torr. After the flow rates of all the gases became stable, microwave having a frequency of 2.45 GHz with 700 W was introduced through the waveguide and the microwave introducing window of the assemble into the discharge space circumscribed by said six cylindrical aluminum substrates to cause glow discharge and to form a charge injection inhibition layer on each of the six cylindrical substrates.

The film-forming conditions in this case were shown in Table 1. Successively, a photoconductive layer and a surface layer were formed under the conditions shown in Table 1 respectively in the same manner as in the case of forming the charge injection inhibition layer. Thus, there were prepared six electrophotographic photosensitive amorphous silicon drums.

The assemble having the resultant six drums (A to F) thereon was lifted into the movable vacuum vessel 130 in the same manner as described above, and these drums were cooled to room temperature therein. The inside of the vacuum vessel 130 was brought to the atmospheric pressure and said six drums were taken out therefrom.

(EXAMPLE 2)

The above procedures of Example 1 were repeated in the same deposition chamber 112, except that the six cylindrical aluminum substrates of the assemble were replaced by new six cylindrical aluminum substrates, to thereby obtain another six electrophotographic photosensitive amorphous silicon drums (A' to F').

Evaluation

Each of the resultant six drums (A to F) in Example 1 was set to a modification of Canon's Electrophotographic Copying Machine NP-7550 for use in experimental purposes (product of CANON KABUSHIKI KAISHA) to make 500,000 copies using a white original. The last copy obtained was examined if it contains any black dot by eyes. The evaluated results obtained were collectively shown in Table 2.

The above evaluation procedures were repeated to examine each of the resultant drums (A' to F') in Example 2. As a result, there were obtained the results shown in Table 2.

Comparative Film-forming Examples By The Known MW-PCVD Apparatus Shown in FIG. 3

(COMPARATIVE EXAMPLE 1)

There were prepared six electrophotographic photosensitive amorphous silicon drum samples (a to f) by the known MW-PCVD apparatus shown in FIG. 3 under the conditions shown in Table 1, wherein there were used six cylindrical aluminum substrates of the same size as in the case of Example 1.

(COMPARATIVE EXAMPLE 2)

The procedures of Comparative Example 1 were repeated in the same MW-PCVD apparatus as used in Comparative Example 1 to thereby obtain six electrophotographic photosensitive amorphous silicon drums (a' to f').

Evaluation

Each of the resultant six drums (a to f) in Comparative Example 1 was evaluated in the same manner as in Example 1.

As a result, there were obtained the results shown in Table 2.

Each of the resultant six drums (a' to f') in Comparative Example 2 was evaluated in the same manner as in Example 1.

As a result, there were obtained the result shown in Table 2.

CONCLUSION

As Table 2 illustrates, it has been recognized that the MW-PCVD apparatus of the present invention enables one to stably and repeatedly mass-produce a desirable electrophotographic photosensitive drums excelling in the electrophotographic characteristics. It has been also recognized that the MW-PCVD apparatus of the present invention makes it possible to automatically mass-produce a desirable electrophotographic photosensitive drums excelling in the electrophotographic characteristics.

TABLE 1

| film-forming conditions | | charge injection inhibition layer | photosensitive layer | surface layer |
|---|---|---|---|---|
| gas used and its flow rate | $SiH_4$ | 500 sccm | 800 sccm | 200 sccm |
| | $H_2$ | 500 sccm | 500 sccm | — |
| | $B_2H_6$ | 2000 ppm | — | — |
| | NO | 20 sccm | — | — |
| | $CH_4$ | — | — | 1000 sccm |
| inner pressure | | 1.5 mTorr | 2 mTorr | 3 mTorr |
| microwave power | | 700 W | 1500 W | 1000 W |
| deposition time | | 10 min | 40 min | 2 min |

TABLE 2

| batch | drum | evaluation |
|---|---|---|
| Example 1 | A | O |
| | B | O |
| | C | Δ |
| | D | O |
| | E | Δ |
| | F | O |
| Example 2 | A' | O |
| | B' | O |
| | C' | O |
| | D' | Δ |
| | E' | O |
| | F' | O |
| Comparative example 1 | a | X |
| | b | X |
| | c | X |
| | d | Δ |
| | e | Δ |
| | f | X |
| Comparative example 2 | a' | Δ |
| | b' | X |
| | c' | X |
| | d' | X |
| | e' | X |
| | f' | X |

Note
O: good
Δ: practically usable
X: practically not usable

What we claim is:

1. In a microwave plasma chemical vapor deposition apparatus which comprises a substantially enclosed deposition chamber, a means for supporting a substrate on which a functional deposited film is to be formed, a means for supplying raw material gases, a means for evacuating the inside of said deposition chamber and a means for generating microwave discharge plasmas in said deposition chamber which includes a waveguide extending from a microwave power source and a microwave introducing window through which a microwave energy is to be introduced into said deposition chamber, the improvement characterized in that said apparatus is provided with a holding member capable of holding said microwave introducing window and said substrate and capable of sealing said deposition chamber in a air-tight state upon film-formation and said apparatus is provided with a means for transporting said holding member under vacuum condition.

2. The apparatus according to claim 1, wherein said microwave introducing window is of a circular form.

3. The apparatus according to claim 1 which includes a plurality of substrate supporting means each having a substrate thereon, on which substrate a functional deposited film is to be formed.

4. The apparatus according to claim 3, wherein each of said substrates is of a cylindrical form.

5. The apparatus according to claim 4, wherein said microwave introducing window is positioned at the center of said holding member and a plurality of cylindrical substrates are concentrically arranged around the microwave introducing window.

* * * * *

UNITED STATES PATENT AND TRADEMARK OFFICE
CERTIFICATE OF CORRECTION

PATENT NO. : 4,972,799

DATED : November 27, 1990

INVENTOR(S) : TERUO MISUMI, ET AL.

Page 1 of 3

It is certified that error appears in the above-identified patent and that said Letters Patent is hereby corrected as shown below:

IN [57] ABSTRACT

Line 15, "a" should read --an--.

COLUMN 2

Line 35, "removl" should read --removal--.
   Line 38, "matters" should read --matter-.
   Line 42, "MW" should read --MW- --.

COLUMN 3

Line 4, "enable" should read --enables--.
   Line 5, "mass produce" should read --mass-produce--.
   Line 67, "substrate" should read --substrates--.

COLUMN 4

Line 51, "assemble" should read --assembly--.
   Line 64, "a" (first occurrence) should read --an--.
   Line 67, "a" (second occurrence) should read --an--.

COLUMN 5

Line 2, "assemble" should read --assembly--.
   Line 4, "130 to," should read --130,--.
   Line 21, "assemble" should read --assembly--.
   Line 29, "assemble" should read --assembly--.
   Line 38, "assemble." should read --assembly.--.

UNITED STATES PATENT AND TRADEMARK OFFICE
CERTIFICATE OF CORRECTION

PATENT NO. : 4,972,799

DATED : November 27, 1990

INVENTOR(S) : TERUO MISUMI, ET AL.

It is certified that error appears in the above-identified patent and that said Letters Patent is hereby corrected as shown below:

COLUMN 5

Line 41, "assemble" should read --assembly--.
    Line 45, "assemble" should read --assembly--.

COLUMN 6

Line 65, "assemble" should read --assembly--.

COLUMN 7

Line 31, "assemble" should read --assembly--.
    Line 48, "assemble" should read --assembly--.
    Line 55, "assemble" should read --assembly--.
    Line 58, "assemble." should read --assembly.--.
    Line 60, "assemble" should read --assembly--.
    Line 63, "assemble" should read --assembly--.

COLUMN 8

Line 25, "assemble" should read --assembly--.
    Line 35, "ble" should read --bly--.
    Line 39, "assemble," should read --assembly,--.
    Line 52, "assemble" should read --assembly--.
    Line 65, "assemble" should read --assembly--.

UNITED STATES PATENT AND TRADEMARK OFFICE
CERTIFICATE OF CORRECTION

PATENT NO. : 4,972,799

DATED : November 27, 1990

INVENTOR(S) : TERUO MISUMI, ET AL.

Page 3 of 3

It is certified that error appears in the above-identified patent and that said Letters Patent is hereby corrected as shown below:

COLUMN 9

Line 7, "assemble" should read --assembly--.
Line 54, "result" should read --results--.

Signed and Sealed this

First Day of September, 1992

Attest:

DOUGLAS B. COMER

Attesting Officer

Acting Commissioner of Patents and Trademarks